United States Patent [19]
Takahashi et al.

[11] Patent Number: 5,382,128
[45] Date of Patent: Jan. 17, 1995

[54] WAFER TRANSFER DEVICE

[76] Inventors: Kiyoshi Takahashi, 17-25 Hirai 7-chome; Kazuo Takahashi, 17-3 Higashikasai 2-chome, both of Edogawa-ku, Tokyo, Japan

[21] Appl. No.: 205,522

[22] Filed: Mar. 3, 1994

[30] Foreign Application Priority Data

Mar. 3, 1993 [JP] Japan .................. 5-065951

[51] Int. Cl.⁶ .............................. B65G 65/30
[52] U.S. Cl. ..................... 414/404; 414/416; 414/417; 414/940; 414/937; 414/749; 118/500
[58] Field of Search ............... 414/935, 937, 939, 940, 414/941, 749, 280, 751, 752, 416, 417, 403, 331, 217, 404, 281, 222, 277; 204/298.25; 118/719, 500

[56] References Cited
U.S. PATENT DOCUMENTS

| | | | |
|---|---|---|---|
| 4,289,040 | 9/1981 | Haluko, Jr. | 414/749 X |
| 4,550,242 | 10/1985 | Uehara et al. | 414/937 X |
| 5,030,056 | 7/1991 | Kitayama et al. | 414/416 X |
| 5,183,370 | 2/1993 | Cruz | 414/937 X |

FOREIGN PATENT DOCUMENTS

| | | | |
|---|---|---|---|
| 144022 | 8/1983 | Japan | 414/417 |
| 173338 | 7/1988 | Japan | 414/937 |
| 42122 | 2/1989 | Japan | 414/937 |
| 64-55837 | 3/1989 | Japan . | |
| 1-129437 | 5/1989 | Japan . | |
| 1-89748 | 6/1989 | Japan . | |
| 1-321649 | 12/1989 | Japan . | |
| 28949 | 1/1990 | Japan | 414/936 |
| 2-41436 | 3/1990 | Japan . | |
| 122541 | 5/1990 | Japan | 414/936 |

*Primary Examiner*—Frank E. Werner
*Attorney, Agent, or Firm*—Skjerven, Morrill, MacPherson, Franklin, & Friel

[57] ABSTRACT

In a wafer transfer device for transferring wafers from a first basket to a second basket, a carriage carries a lifting member which is vertically slidably supported by a carriage main body, and a plurality of wafer support plates are carried by the lifting member. As the wafer support tables carried by the carriage move through the second basket and enters the first carriage, the lifting member is lifted by a cam slot engaging with a cam follower provided in the lifting member so as to lift the wafers received in the first basket clear from their supporting surfaces supporting their side edges. The carriage is then reversed, and when the wafer support plates are placed into the second basket, the cam slot causes the lifting member to be lowered so as to rest the side edges of the wafers the corresponding supporting surfaces. By providing two different paths in the cam slot and switching the cam follower in an appropriate manner, it is also possible to transfer wafers from the second basket to the first basket. The device is so simple that it can be made of material free from emission of contaminants, and the fabrication cost can be minimized.

9 Claims, 11 Drawing Sheets

WAFER TRANSFER DEVICE

TECHNICAL FIELD

The present invention relates to a wafer transfer device for transferring a plurality of semiconductor wafers or other wafers from one basket to another. The basket for carrying a plurality of wafers is provided with a plurality of slots along the inner surfaces of mutually opposing walls for receiving side edges of the wafers, and is widely used for carrying wafers between different parts of a semiconductor device manufacturing plants or between different semiconductor device manufacturers. To keep the wafers received in the basket free from contamination, the basket is made of material free from emission of contaminants, and sometimes provided with a lid to define a fully enclosed container. Some baskets have open bottoms for allowing the wafers to be processed while the wafers are received in the basket.

BACKGROUND OF THE INVENTION

An example of a conventional wafer transfer device is disclosed in Japanese utility model laid open publication (kokai) No. 2-41436. According to this conventional device, a carriage carrying a plurality of wafer support plates is moved longitudinally by a low speed electric motor, and a table supporting a wafer basket is moved vertically by another low speed motor. Thus, by appropriately synchronizing the horizontal movement of the carriage with the vertical movement of the basket support table, it is possible to transfer a plurality of wafers from one basket to another.

Such a device is required to be free from contaminants because semiconductor wafers become easily unusable when contaminated by extremely small amounts of chemicals and particles. The use of electric motors requires an associated control circuit and, possibly, a microprocessor for controlling the operation of the electric motors. Thus, a significant cost will be necessary to construct such a device.

BRIEF SUMMARY OF THE INVENTION

In view of such problems of the prior art, a primary object of the present invention is to provide a wafer transfer device which has a simple structure and can be made of material free from emission of contaminants.

A second object of the present invention is to provide a wafer transfer device which can be actuated by hand or other simple power means and can be therefore constructed at low cost.

A third object of the present invention is to provide a wafer transfer device which can handle wafers without causing any damage to them.

A fourth object of the present invention is to provide a wafer transfer device which can accommodate differences in the external configurations of wafer baskets between which wafers are to be transferred.

These and other objects of the present invention can be accomplished by providing a wafer transfer device for transferring wafers from a first basket to a second basket, each of the baskets having an open front end, and a plurality of horizontal slots defined in mutually opposing inner side walls thereof for supporting a plurality of wafers in a vertically spaced relationship by receiving side edges of the wafers in the slots, comprising: a base; a first basket support table mounted on the base for supporting a first basket; a second basket support table mounted on the base for supporting a second basket; a carriage slidably supported by the base and guided by guide means provided on the base so as to be slidable toward and away fron the first and second wafer baskets; actuation means for moving the carriage toward and away from the open front ends of the first and second baskets; a plurality of wafer support plates carried by the carriage horizontally and in a vertically spaced relationship to be inserted in gaps defined between the wafers carried by the first wafer basket; and cam means provided in the base for lifting the wafer support plates when the carriage passes a first part of the guide means where the wafer support plates are inserted in the gaps defined between the wafers carried by the first basket to thereby lift the wafers from ribs defined between the slots of the first basket, and lowering the wafer support plates when the carriage passes a second part of the guide means where side edges of the wafers supported by the wafer support plates are placed in the slots provided in the inner side walls of the second basket to thereby lower the wafers on ribs defined between the slots of the second basket.

Thus, the wafer transfer device according to the present invention can have such a simple structure that it can be easily made of materials free from emission of contaminants, and can be designed so as to be actuated by hand or other simple power means and can be therefore constructed at low cost.

Typically, the guide means comprises a guide slot for guiding the carriage. According to a preferred embodiment of the present invention, the carriage comprises a lifting member vertically slidably supported by a carriage main body, and the wafer support plates are mounted on the lifting member, the cam means consisting of a cam slot provided in the base and receiving a cam follower provided in the lifting member. Preferably, the first basket support table is located behind the second basket support table, the second basket being provided with an open rear end, and the carriage is guided by the guide slot over a range in which the wafer support plates can be place inside the first and second wafer baskets.

When it is desired to have the device capable of reversing the direction of transfer, the cam slot may include a first path for transferring wafers from the first wafer basket to the second wafer basket, and a second path for transferring wafers from the second wafer basket to the first wafer basket while the cam follower is carried by the lifting member so as to be moveable by switch means between a first position for engaging the cam follower with the first path of the cam slot and a second position for engaging the cam follower with the second path of the cam slot.

To accommodate the variations in the external configurations and dimensions of wafer baskets of different types, the first basket support table may comprise a pair of positioning pillars on which a flange of the open front end of the first basket abuts, and the pillars may comprise means for positioning the flange in cooperation with associated positioning means provided on the flange.

To facilitate the properly positioning the wafer basket of the wafer transfer device, and reduce possible impacts of the wafer baskets, the wafer transfer device may further comprise elastic support means for elastically urging the first basket placed on the first basket support table upward, and means for pushing a rear end of the first wafer basket against the positioning pillars.

If the first wafer support table is provided with means for allowing a receding movement thereof when the carriage has abutted the first wafer support table, and spring means for urging the first wafer support table against the receding movement thereof, the cam means being provided with such a cam profile as to allow the wafers carried by the first basket to be lifted or lowered while the first wafer support table and the carriage are moving jointly by virtue of the means for allowing a receding movement of the first wafer support table and the spring means, it is possible to prevent any rubbing between the wafer supporting plates and the wafers through elimination of relative horizontal movement between them, and can thereby minimize damages to the wafers during the handling thereof.

BRIEF DESCRIPTION OF THE DRAWINGS

Now the present invention is described in the following with reference to the appended drawings, in which:

FIGS. 4a and 11b are a side view and a rear view showing the first basket supporting table with a wafer basket mounted thereon.

DETAILED DESCRIPTION OF THE PREFERRED EMBODIMENTS

Referring to FIGS. 1 through 4 showing the general structure of a first embodiment of the wafer transfer device according to the present invention, the device comprises a main body A incorporating a main structure of the wafer transfer device, a wafer lifting unit B, and a basket supporting unit C for supporting first and second baskets C1 and C2. The main body A comprises a rectangular base consisting of a pair of elongated side plates 1 and 2, and a pair of end plates 3 and 4, and a carriage 5 having a lower end received between the side plates 3 and 4 so as to be moveable in a rectangular slot defined inside the base from one longitudinal end to another by means of a guide structure described hereinafter. For the convenience of description, the end plate 4 remote from the baskets C1 and C2 is defined as being located on the starting end while the end plate 3 adjacent to the baskets C1 and C2 is defined as being located on the terminal end.

Figure 4:
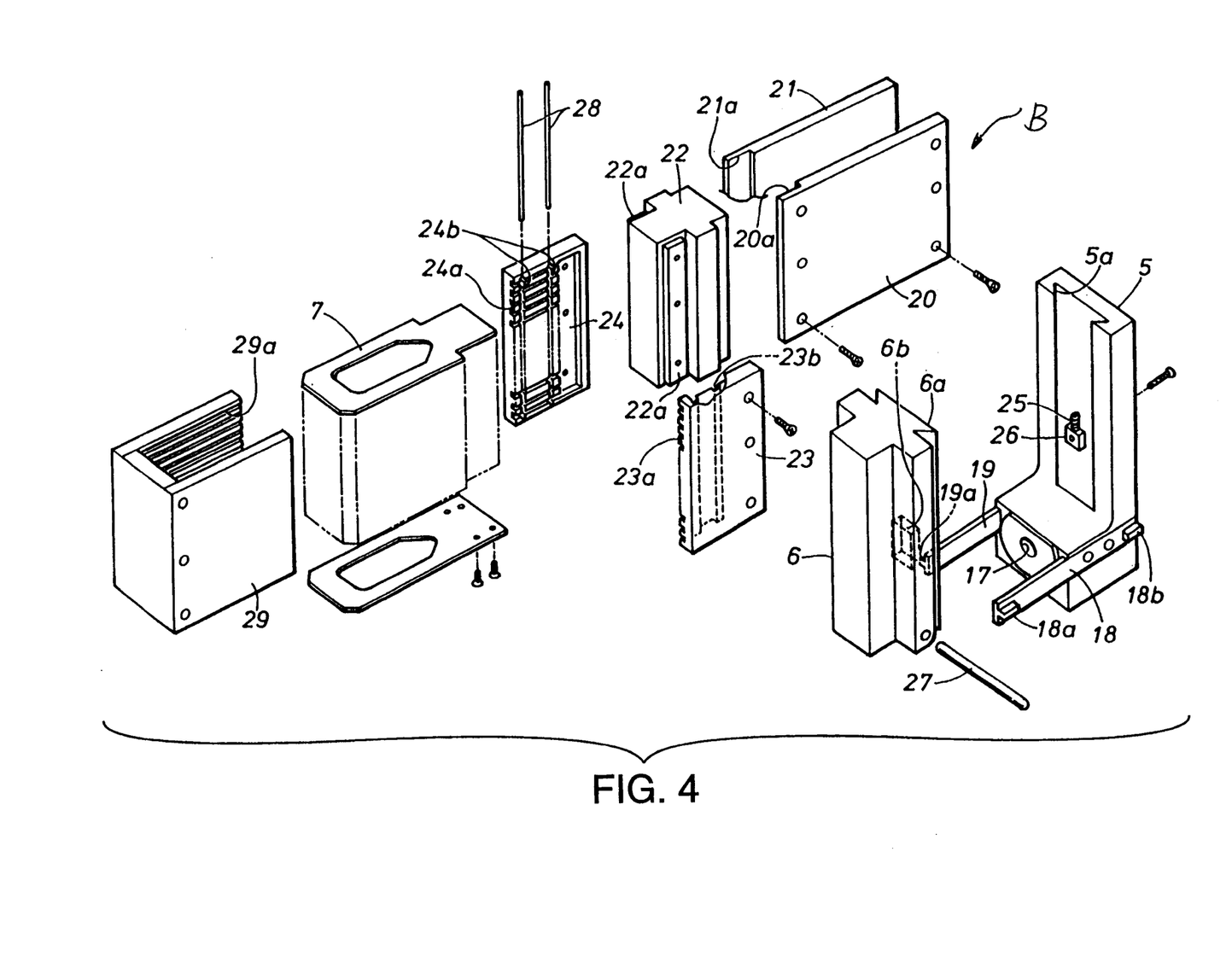
FIG. 4 is an exploded perspective view of the structure related to the carriage of the wafer transfer device according to the present invention.

Referring to FIG. 4, a pair of support rods 18 and 19 are fixedly secured on either side of a lower portion of the carriage 5, and each of the support rods 18 and 19 is provided with a pair of guide shoes 18a and 18b or 19a and 19b on either longitudinal end of the support rod 18 or 19. These guide shoes 18a, 18b, 19a and 19b are received in guide slots 11 and 12 provided in the inner surfaces of the side plates 1 and 2.

Figure 1:
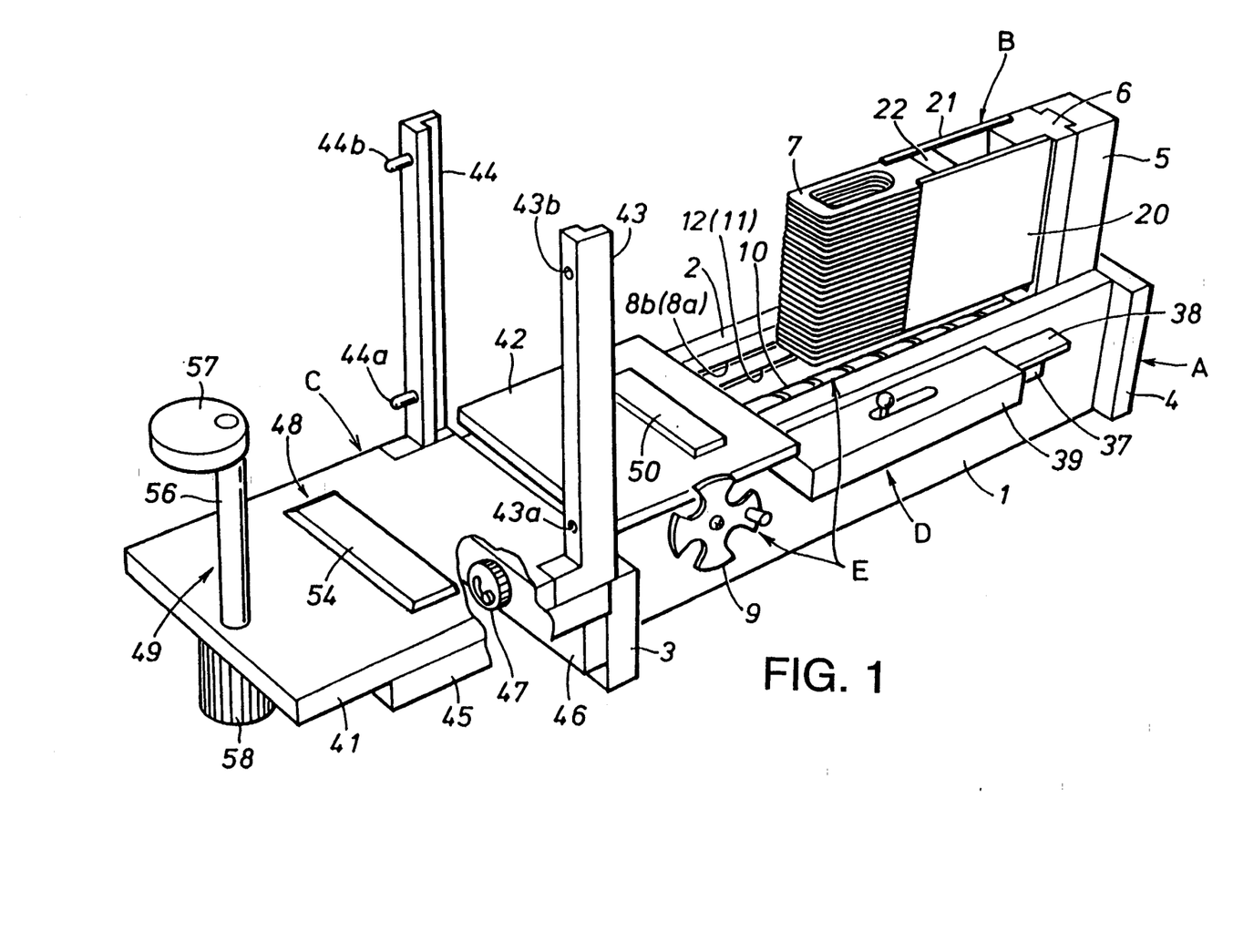
FIG. 1 is an overall perspective view of a preferred embodiment of the wafer transfer device according to the present invention.
Figure 2A:
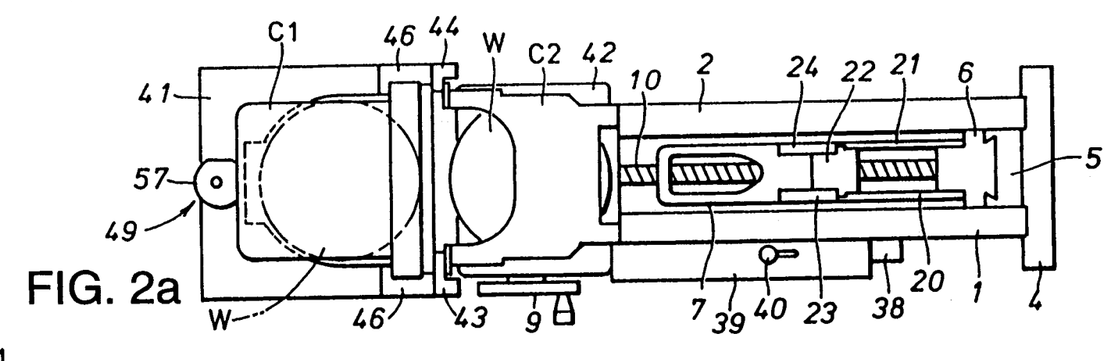
FIGS. 2a through 2c are a plan view, a front view and a side view of the wafer transfer device according to the present invention.
Figure 2B:
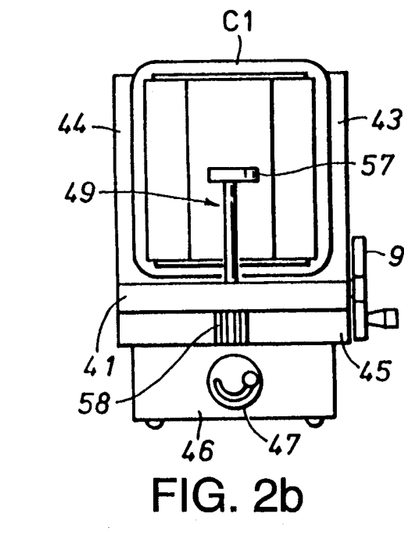
Figure 2C:
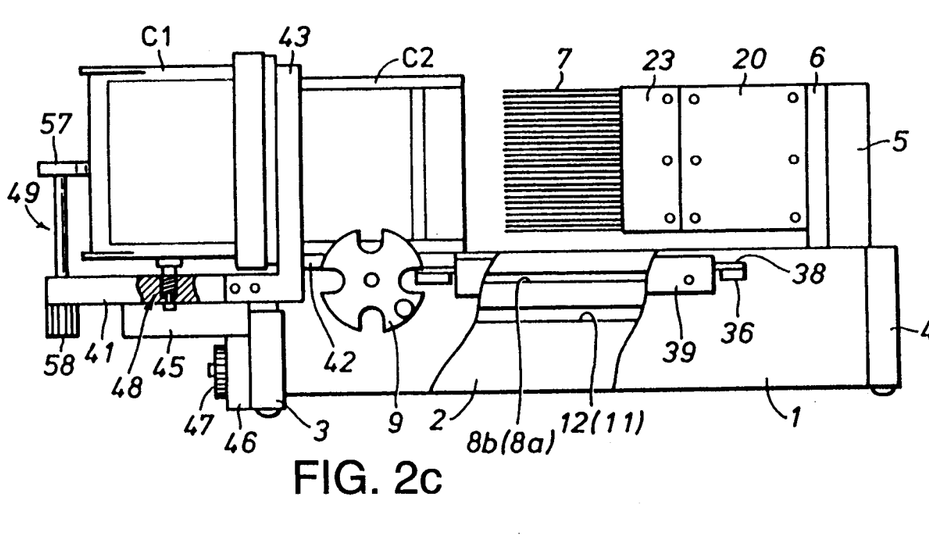
Figure 3:
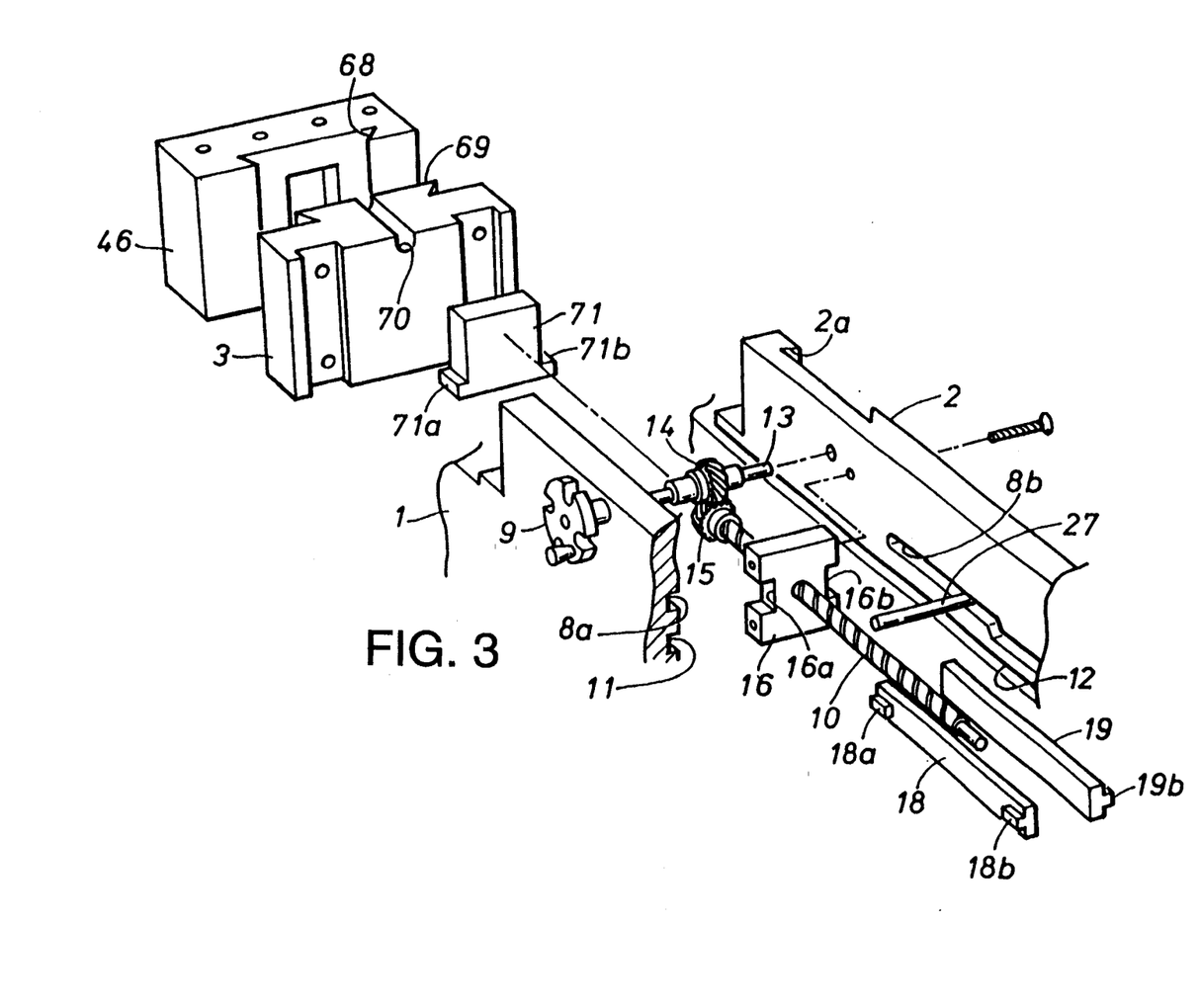
FIG. 3 is an exploded fragmentary perspective view of the wafer transfer device showing the details of its drive structure.

Referring to FIG. 3, a rotary shaft 13 is passed through the two side plates 1 and 2, and a hand wheel 9 is secured to an end of the rotary shaft 13 extending out of one of the side plates 1. A central part of the rotary shaft 13 carries a helical gear 14 which meshes with another helical gear 15 fixedly mounted on a screw rod 10 extending perpendicularly to the rotary shaft 13. One end of the screw rod 10 is supported by a bearing provided in a bearing block 16 provided inside the base adjacent to the helical gear 15, and the other end of the screw rod 10 is threaded into a threaded opening 17 provided centrally in a lower part of the carriage 5.

Thus, by rotating the hand wheel 9 in either direction, the screw rod 10 is rotated and the carriage 5 is moved longitudinally in a corresponding direction guided by the engagement between the guide shoes 18a, 18b, 19a and 19b and the guide slots 11 and 12. As shown in FIG. 3, the bearing block 16 is provided with notches 16a and 16b on either side end to avoid interference with the supporting rods 18 and 19 when the carriage 5 has moved close to the bearing block 16.

The carriage 5 carries thereon the wafer lifting unit B in a vertically moveable manner as best illustrated in FIG. 3. The wafer lifting unit B comprises a lifting block 6 retained by the carriage 5 in a vertically slidable manner, a pair of connecting plates 20 and 21 fixedly secured by screws, at their base ends, on either side end of the lifting block 6, and a support block 22 fitted in vertical slots 20a and 21a provided in the inner surfaces of the free ends of the connecting plates 20 and 21 and fixedly secured by screws.

The lifting block 6 is slidably retained at its dovetail projection 6a by a vertical slot 5a provided in the carriage 5, and the surface of the dovetail projection 6a facing the vertical slot 5a is centrally provided with a rectangular recess 6b. A spring block 26 is fixedly secured to a central part of the bottom surface of the vertical slot 5a, and a compression coil spring 25 is secured to the upper surface of the spring block 25. The spring block 26 is mounted in position inside the recess 6b after the lifting block 6 is slidably engaged by the vertical slot 5a, and the compression coil spring 25 thus urges the lifting block 6 away from its lowermost position.

A cam shaft 27 is laterally passed through a lower part of the lifting block 6, and has such a length that the two ends of the cam shaft 27 can be selectively received in cam slots 8a and 8b provided in the side plates 1 and 2 as more fully described hereinafter.

A pair of side support plates 23 and 24 are fixedly secured, at their base ends, to mounting side surfaces 22a of the support block 22. The inner surfaces of the side support plates 23 and 24 are provided with a plurality of horizontal slots 23a and 24a each at a constant vertical pitch. Base ends of wafer support plates 7 are fitted into these horizontal slots 23a and 24b, and are fixedly secured by placing, in advance, soft polyurethane rods 28, silicone rubber sealant or elastic sealing material in vertical slots 23b and 24b provided in the inner surfaces of the support plates 23 and 24 across the horizontal slots 23a and 24a before mounting the two side support plates 23 and 24 on the mounting side surfaces 22a of the support block 22.

When mounting the wafer support plates 7 between the side support plates 23 and 24, it is advantageous to use an assembling tool 29 (refer to FIG. 4) provided with horizontal slots 29a for receiving the free ends of the wafer support plates 7 at the prescribed vertical pitch. Because the assembling tool 29 can retain the wafer support plates 7 at the prescribed vertical pitch, it can hold the wafer support plates 7 in a proper positional relationship while the side support plates 23 and 24 are secured to the mounting side surfaces 22a with screws to interpose the base ends of the wafer support plates 7.

Figure 5A:
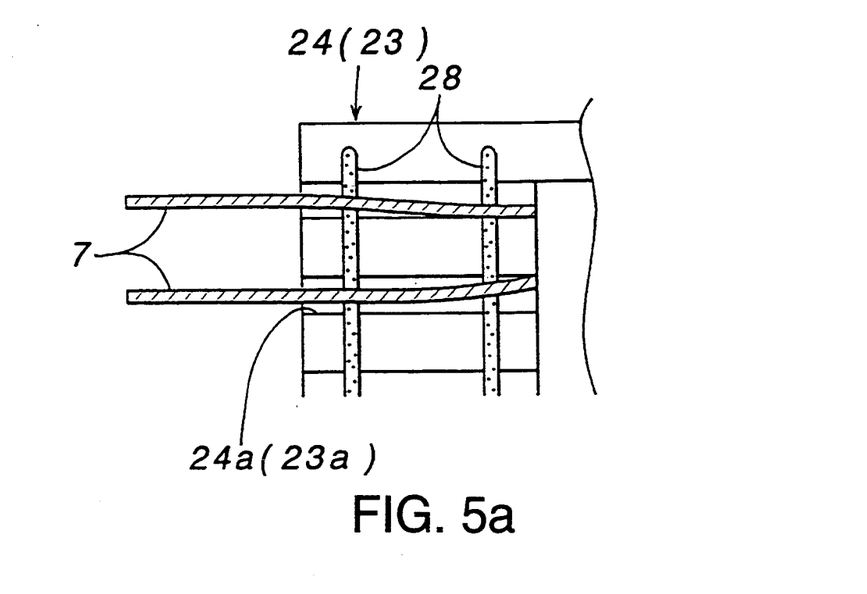
FIGS. 5a and 5b are fragmentary sectional views showing the mode of mounting the wafer support plates.
Figure 5B:
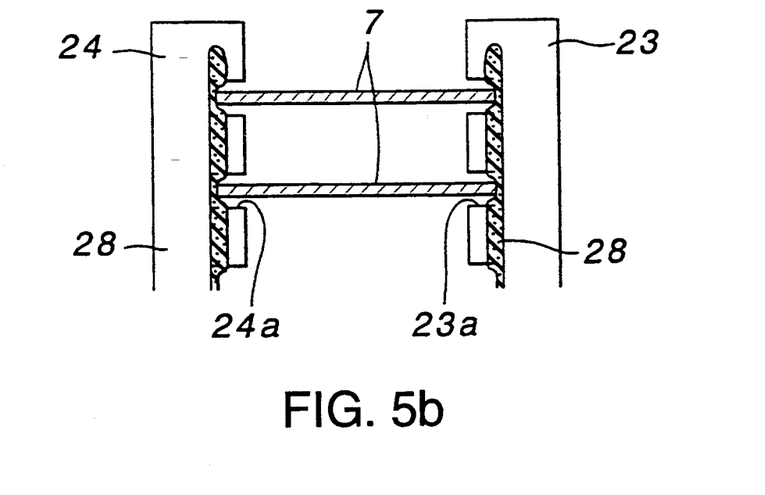

Furthermore, because the assembling tool 29 can hold the free ends of the wafer support plates 7 in mutually parallel relationship even when there is some warping in the wafer support plates 7 as illustrated in FIG. 5a, it is possible to eliminate the problems which might be created by such warping of the wafer support plates by appropriately accommodating the warping of the wafer support plates 7 with the plays between the slots 23a and 24a and the base ends of the wafer support plates 7, and thereafter fixedly securing the base ends of the wafer support plates 7 by curing of the sealant 28 or with the elasticity of the sealant 28 as illustrated in FIGS. 5a and 5b.

The wafer support plates 7 may consist of stainless steel, but more preferably consists of aluminum plates having an anodized surface because the aluminum has a smaller specific weight than stainless steel, and reduces the tendency of the wafer support plates to droop under their own weight, and the anodized surface substantially eliminates the possibility of contamination by metallic ions.

Figure 6A:
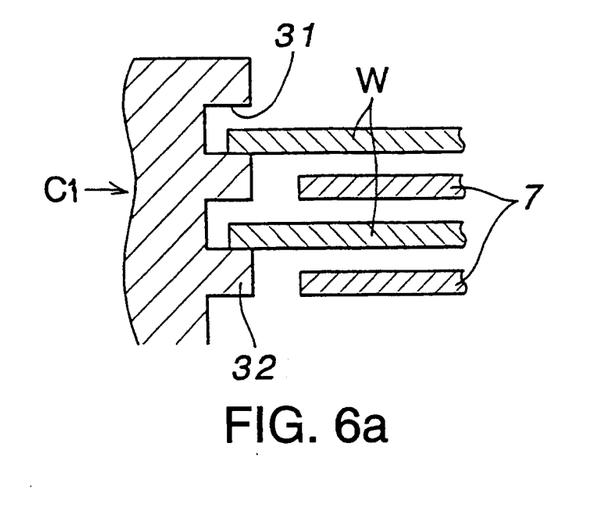
FIGS. 6a and b fragmentary sectional views showing the mode of carrying the wafers with the wafer support plates.
Figure 6B:
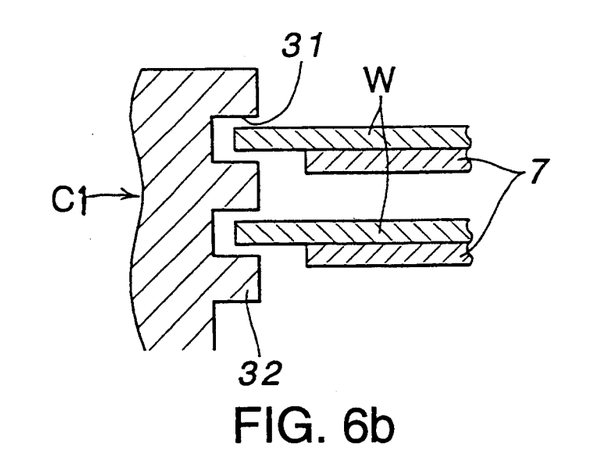

Referring to FIGS. 6a and 6b, wafers W are initially received in slots 31 provided in the basket C1 at event pitch with their peripheral edges resting on ribs 32 defining the slots 31. Therefore, in order to transfer the wafers W from the basket C1 to another basket, it is necessary to align the slots 31 and the ribs 32 of the first basket C1 to those of the second basket. Additionally, the wafer support plates 7 must be inserted between the wafers W to lift the wafers W from the ribs 32 of the first basket C1 and, after carrying the wafers W from the first basket C1 to the second basket, to lower them on the ribs 32 of the second basket.

Thus, the wafer support plates 7 are required to have a lowered state L for aligning with the gaps between the wafers W resting on the ribs 32, a lifted state H for lifting the wafers W away from the ribs 32, and transitional states for moving from the lowered state L to the lifted state H and from the lifted state H to the lowered state L.

Transfer guide means D which is designed to produce such different states of the wafer support plates 7 includes the aforementioned cam slots 8a and 8b for selectively receiving the associated ends 27a and 27b of the cam shaft 27. These cam slots 8a and 8b extend substantially horizontally next to the guide slots 11 and 12. The cam slots 8a and 8b are provided with cam profiles for achieving the different states of the wafer support plates 7 for transferring the wafers from one basket C1 to another C2 by lifting or lowering the lifting block 6 as the carriage 5 is moved forward or rearward guided by the guide slots 11 and 12.

Figure 7A:
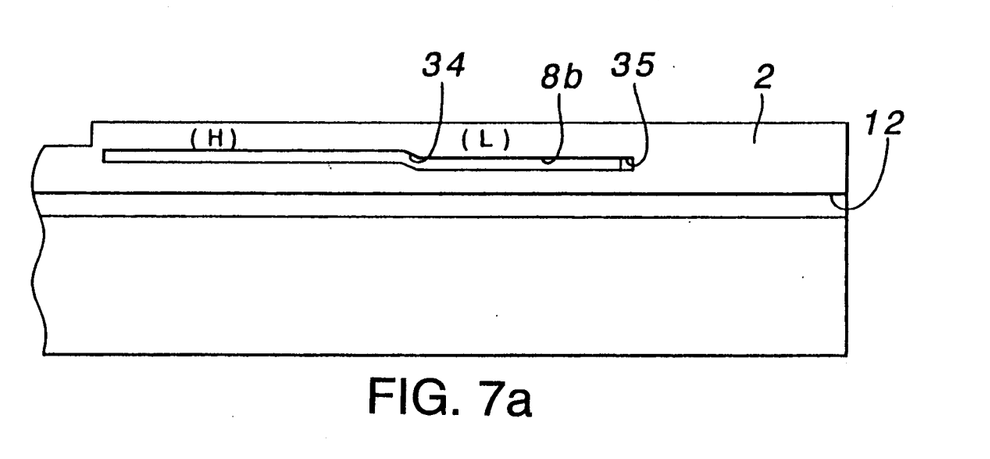
FIGS. 7a and 7b are fragmentary side views of the inner surfaces of the side plates of the main body of the wafer transfer device according to the present invention, one of the side plates 1 being drawn as a mirror image to facilitate the comparison with the other side plate 2.
Figure 7B:
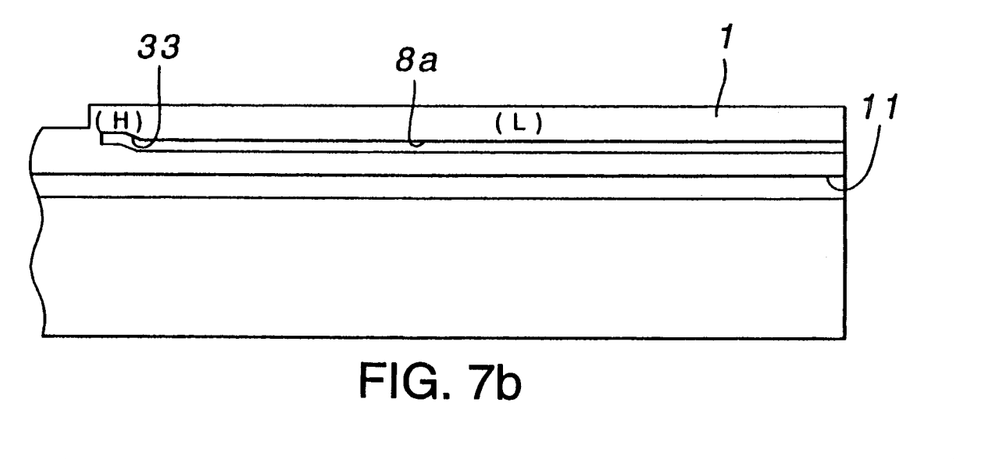

Referring to FIGS. 7a and 7b, the cam slot 8a provided on the side plate 1 is provided with a transitional cam portion 33 adjacent to its terminal end, and the cam slot 8b is provided with a transitional cam portion 34 in an intermediate portion thereof. The cam slot 8a extends all the way to the starting end while the cam slot 8b ends some distance short of the starting end. Therefore, when the carriage 5 is near the starting end, the cam shaft 27 is always pushed into the cam slot 8a.

Figure 8:
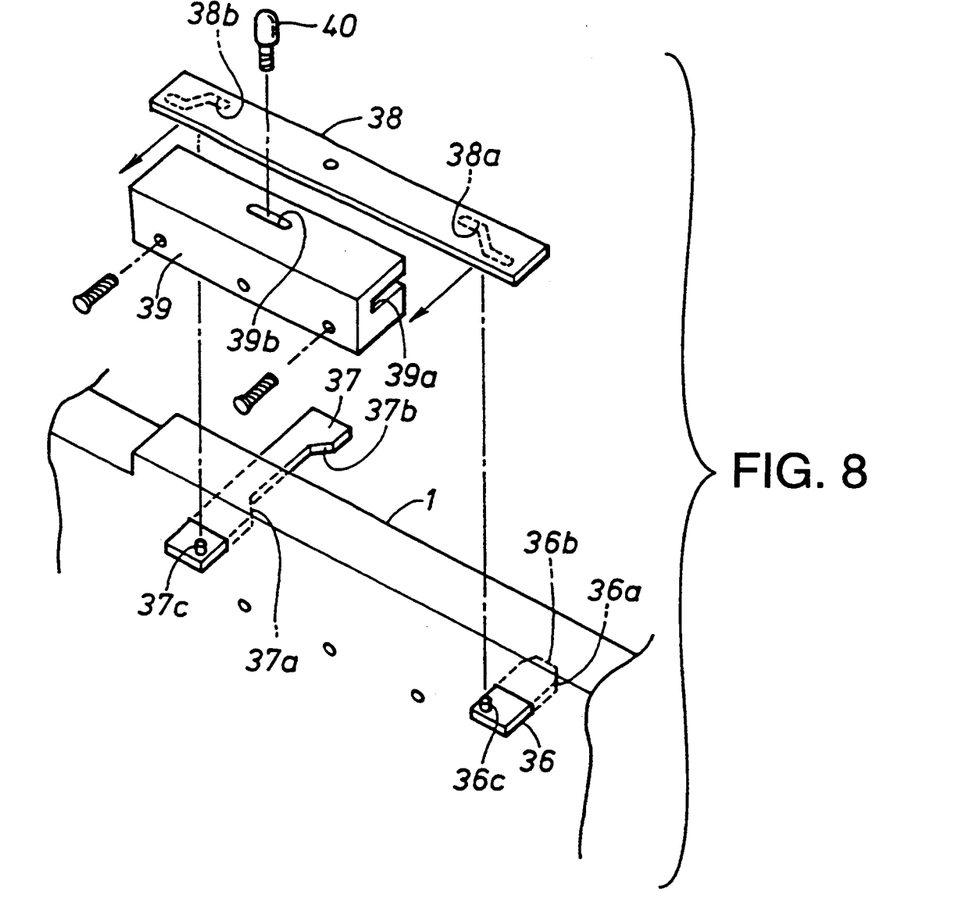
FIG. 8 is a fragmentary exploded perspective view showing the structure for switching the guide slots for the carriage carrying the wafer support plates.
Figure 9A:
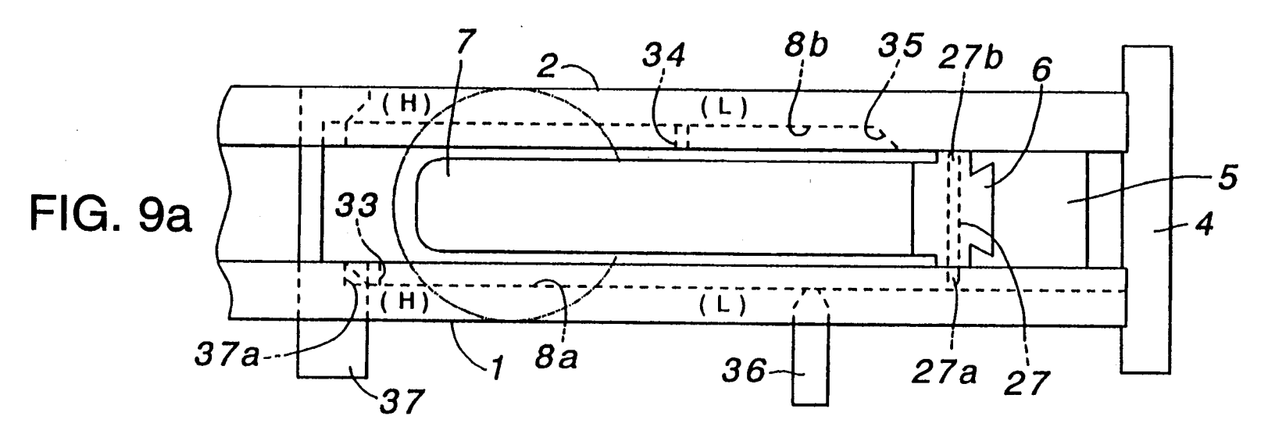
FIGS. 9a and b are a fragmentary exploded perspective view showing the structure for switching the guide slots for the carriage carrying the wafer support plates.
Figure 9B:
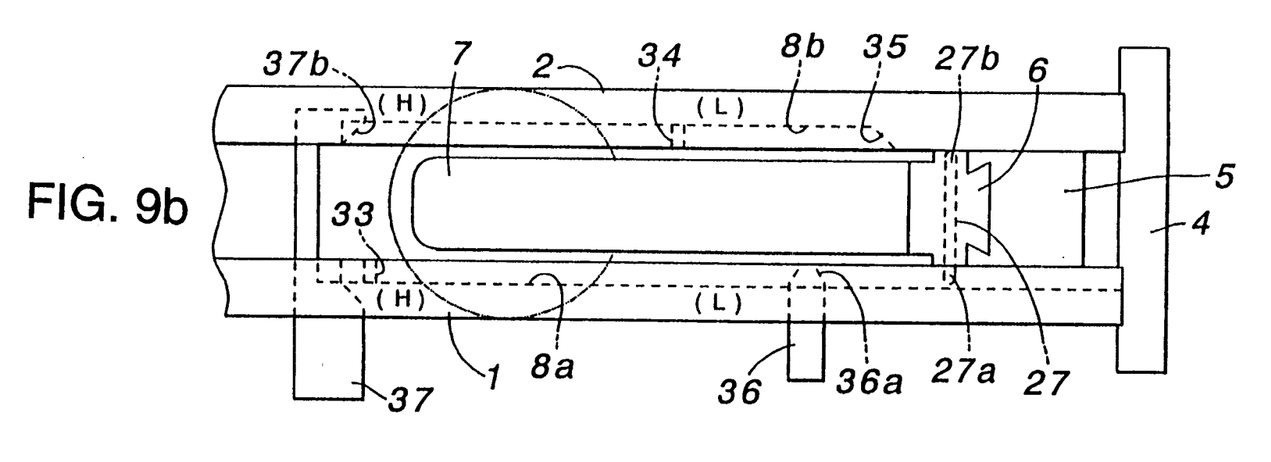

FIGS. 8, 9a and 9b show the structure for shifting the cam shaft 27 laterally to determine by which of the slots 8a and 8b the cam shaft 27 should be engaged. This cam shaft shifting structure comprises a first cam 36 consisting of a substantially rectangular plate which is passed through an opening provided a part of the side plate 1 adjacent to its starting end and can move into and out of the cam slot 8a, a second cam 37 consisting of a C-shaped plate which is passed through an opening provided in a part of the side plate 1 adjacent to its terminal end and extends across the space between the two side plates 1 and 2. The first cam 36 is provided with a pair of slopes 36a and 36b which can be selectively placed in the cam slot 8a. The second cam 37 is provided with a pair of slopes 37a and 37b which can be selectively placed in the cam slots 8a and 8b, respectively. It should be noted that the slopes 36a and 36b of the first cam 36 are placed in the cam slot 8a simultaneously but one of the slopes 37a and 37b can be placed in the corresponding one of the cam slots 8a and 8b only when the other of the slopes 37a and 37b has been moved out of the corresponding one of the cam slots 8a and 8b.

The first and second cams 36 and 37 are provided with pins 36a and 37a, respectively, which are received in cam slots 38a and 38b provided in a plate member 38 slidably received in a slot 39a of a switch block 39. The switch block is fixedly secured to the external surface of the side plate 1. A knob 40 is passed through a slot 39b provided in the switch block 39, and fixedly secured to the plate member 38. The cam slots 38a and 38b are provided with such shapes that one of the first and second cams 36 and 37 is pushed into the corresponding opening provided in the side plate while the other of the first and second cams 36 and 37 is pulled out of the corresponding opening provided in the side plate 1 by moving the knob 40 along the side plate 1 in either direction.

FIG. 9a shows the positions of the first and second cams 36 and 37 which are suitable for transferring the wafers W of the first basket C1 remote from the main body A to the second basket C2 which is nearer to the main body A. More specifically, when the carriage 5 along with the lifting block 6 slidably receiving the cam shaft 27 is moved from the starting end toward the terminal end by turning the hand wheel 9 in the normal direction, the wafer support plates 7 pass through the second basket C2 in their lowered state L and are received in the gaps between the wafers W of the first basket C1. As the carriage 5 continues to be moved toward the first basket C1, the cam shaft 27 along with the lifting block 6 is lifted by the transitional cam portion 33. This upward movement of the lifting block 6 causes the wafer support plates 7 to scoop up the wafers W of the first basket C1.

When the carriage 5 has been advanced all the way, the cam shaft 27 is shifted by the slope 37a of the second cam 37 which causes the cam shaft 27 be engaged by the cam slot 8b instead of the cam slot 8a. In this condition, by turning the hand wheel 9 in the reverse direction, the carriage 5 is moved backward or toward the starting end. Initially, the wafer support plates 7 are in their lifted state H, but as the carriage 5 recedes further, the cam shaft 27 along with the lifting block 6 is lowered by the transitional cam portion 34 of the cam slot 8b. At this point, the wafers W carried by the wafer supporting plates 7 are in the second basket C2, and are lowered on the ribs 32 of the second basket C2. The hand wheel 9 continues to be turned in the reverse direction, and the cam shaft 27 along with the lifting block 6 is restored to the initial condition when the carriage 5 has receded all the way to the starting end.

FIG. 9b shows the positions of the first and second cams 36 and 37 which are suitable for transferring the wafers W of the second basket C2 adjacent to the main body A to the first basket C1 which is more remote from the main body A. More specifically, when the carriage 5 along with the lifting block 6 slidably receiving the cam shaft 27 is moved from the starting end toward the terminal end by turning the hand wheel 9 in the normal direction, the cam shaft 27 is moved out of the cam slot 8a and into the cam slot 8b by engaging with the slope 36a of the first cam 36. Therefore, when the wafer supporting plates 7 are fitted into the gaps between the wafers W of the second basket C2, they are lifted so as to lift the wafers W from the ribs 32 of the second basket C2 as the cam shaft 27 rides over the upward slope forming the transitional cam portion 34 of the cam slot 8b.

Thus, the wafers W are carried by the wafer support plates 7 at their lifted state to the first basket C1 as the carriage 5 is moved all the way to the terminal end. When the carriage 5 has reached the terminal end, the cam shaft 27 is shifted by the slope 37b of the second cam 37 out of the cam slot 8b and into the cam slot 8a. As a result, as soon as the hand wheel 9 is turned in the reverse direction and the carriage 5 starts receding away from the terminal end, the cam shaft 27 passes through the transitional cam portion 33 of the cam slot 8a, and the wafer support plates 7 lower the wafer W on the ribs 32 of the second basket C2. The wafer support plates 7 at their lowered state recede further along with the carriage 5, and the cam shaft 27 is again moved out of the cam slot 8a and into the cam slot 8b by engaging with the slope 36b of the first cam 36 with the result that the cam shaft 27 restores its original state when the carriage 5 has been returned to the starting end.

Thus, according to this embodiment, simply by moving the knob 40 in a prescribed direction, the cam shaft 27 is made to follow the selected one of the cam slots 8a and 8b, and the user can choose from which of the baskets C1 and C2 the wafers should be transferred to the other. In this case, the second basket C2 must consist of a basket having no bottom, but the first basket may be either provided with a bottom or not provided with a bottom.

The basket positioning unit C of this embodiment comprises a first basket support table 41 provided remote from the main body A for placing the first basket C1 thereon, a second basket support table 42 provided between the first basket support table 41 and the main body A for placing the second basket C2 thereon, positioning pillars 43 and 44 located on either side of the basket positioning unit C between the two basket support table 41 and 42, a moveable support table 45 supporting the first basket support table 41 in a longitudinally slidable manner, a vertical guide plate 46 carrying the moveable support table 45 on its upper surface and vertically moveably supported by the end plate 3, height adjusting means which allows the height of the vertical guide plate 46 along with the first basket support table 41 to be adjusted by the turning of a knob 47, elastic support means 48 which urges the basket C1 upward when it is placed on the basket support table 41, and rear end support means 49 for urging the first basket C1 against the positioning pillars 43 and 44.

The second basket support table 42 is slidably received by vertical slots 1a and 2a provided in the side plates 1 and 2, and can be vertically adjusted by means not shown in the drawings. Thus, if necessary, the height of the second basket support table 42 can be appropriately adjusted so that the wafer support plates 7 may be properly aligned with the gaps between the wafers W received in the second basket C2. The upper surface of the second basket support table 42 is provided with a spacer 50 placing the second basket C2 horizontally in spite of the irregularities in the bottom surface of the second basket C2.

One of the positioning pillars 43 mounted on the first basket support table 41 is provided with a pair of engagement holes 43a and 43b while the other positioning pillars 44 is provided with a pair of engagement projections 44a and 44b so that corresponding engagement projections 51a and the holes 51b provided in a flange 51 surrounding the open front end of the second basket C1 may engage with these engagement holes 43a and 43b, and engagement projections 44a and 44b to properly position the basket C1 with respect to the positioning pillars 43 and 44. Because the height L of the lower surface of the lowermost wafer W supported by the ribs 32 from the bottom surface of the basket C2 varies depending on the manufacturer of the basket, it is preferable to select the distance between the upper surface of the basket support table 41 and the lower engagement hole 43a and the lower engagement projection 44a so as to accommodate a basket having the greatest height L.

Figure 11A:
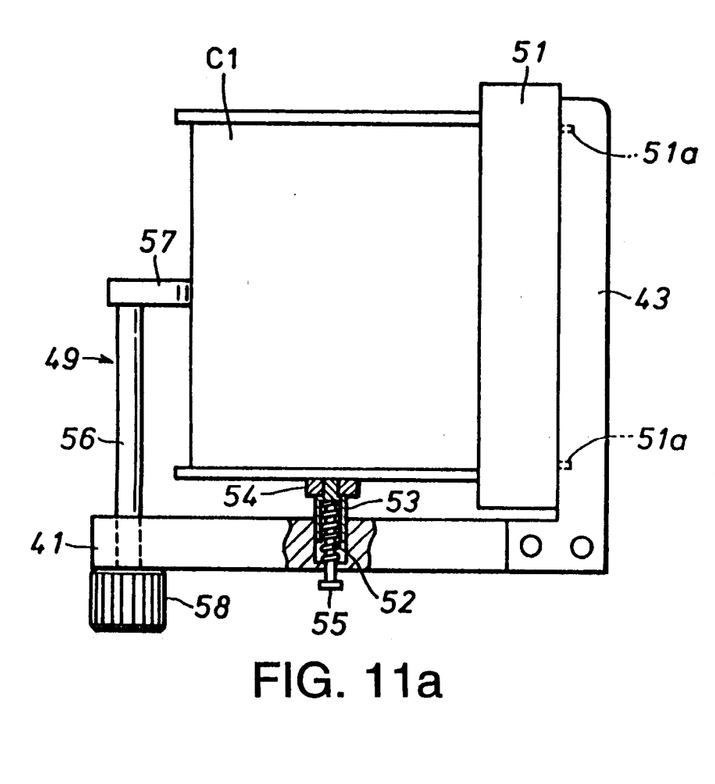
Figure 11B:
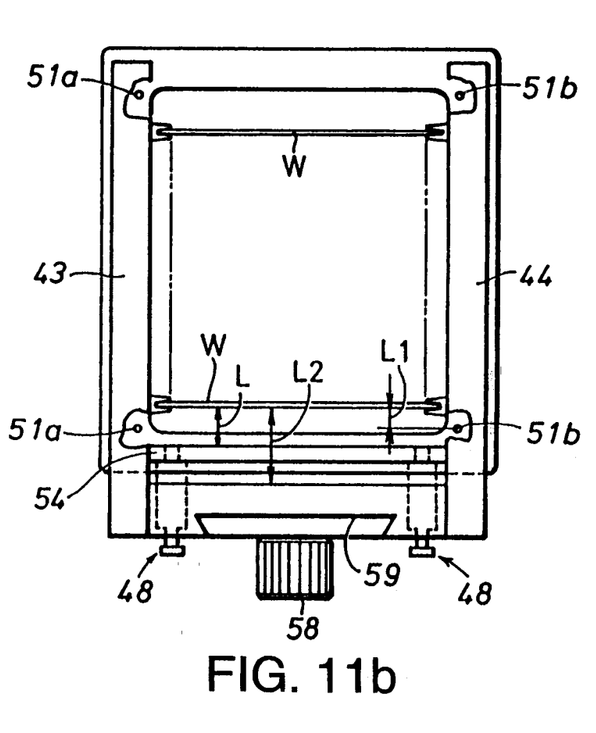

As seen in FIGS. 11a and 11b the elastic support means 48 comprises a support strip 54 for directly supporting the lower surface of the basket C1, a cylindrical spring guide 53 securely engaged to the support strip 54 and receiving a compression coil spring 52 therein, and an engagement pin 55 threadably fitted into the spring guide 53 from the lower surface of the basket support table 41. Thus, when the support strip 54 is pushed down by the weight of a basket placed thereon, the support strip 54 is depressed by a distance corresponding to the weight of the basket by the compression of the compression coil spring 52, and rises again when the basket is removed therefrom.

Therefore, when placing the basket C1 on the basket support table 41, the projections and holes 51a and 51b of the flange 51 of the basket can be relatively easily fitted together with the corresponding engagement holes 43a and 43b, and projections 44a and 44b of the positioning pillars 43 and 44 with the support strip 54 elastically urged upward by the elastic support means 48 as compared to the case in which the basket must be kept clear from the upper surface of the basket support table 41 when doing so. Furthermore, the elastic support means 48 in combination with the support strip 54 will be also useful as a cushion for preventing impulsive shock to the basket C1. However, this feature is not essential to the present invention, and the elastic support means 48 may be omitted if desired. The elastic support means 48 and the support plate 47 may be replaced with a layer of cushion material such as urethane rubber placed on the basket support table 41.

Rear end engaging means 49 is provided on the first basket support table 41 for determining the position of the rear end of the first basket C1 on the first basket support table 41. The rear end engaging means 49 comprises an eccentric pusher disk 57 eccentrically mounted on an upper end of a rotary shaft 56 rotatably passed through the first basket support table 41. The end of the rotary shaft 56 extending from the lower surface of the first basket support table 41 is provided with a knob 58 for turning the rotary shaft 56. Thus, by turning the knob 58 appropriately, it is possible to securely hold the basket C1 between the eccentric disk 57 and the positioning pillars 43 and 44 even when there is some error or fluctuation in the depth of the basket C1.

Figure 10:
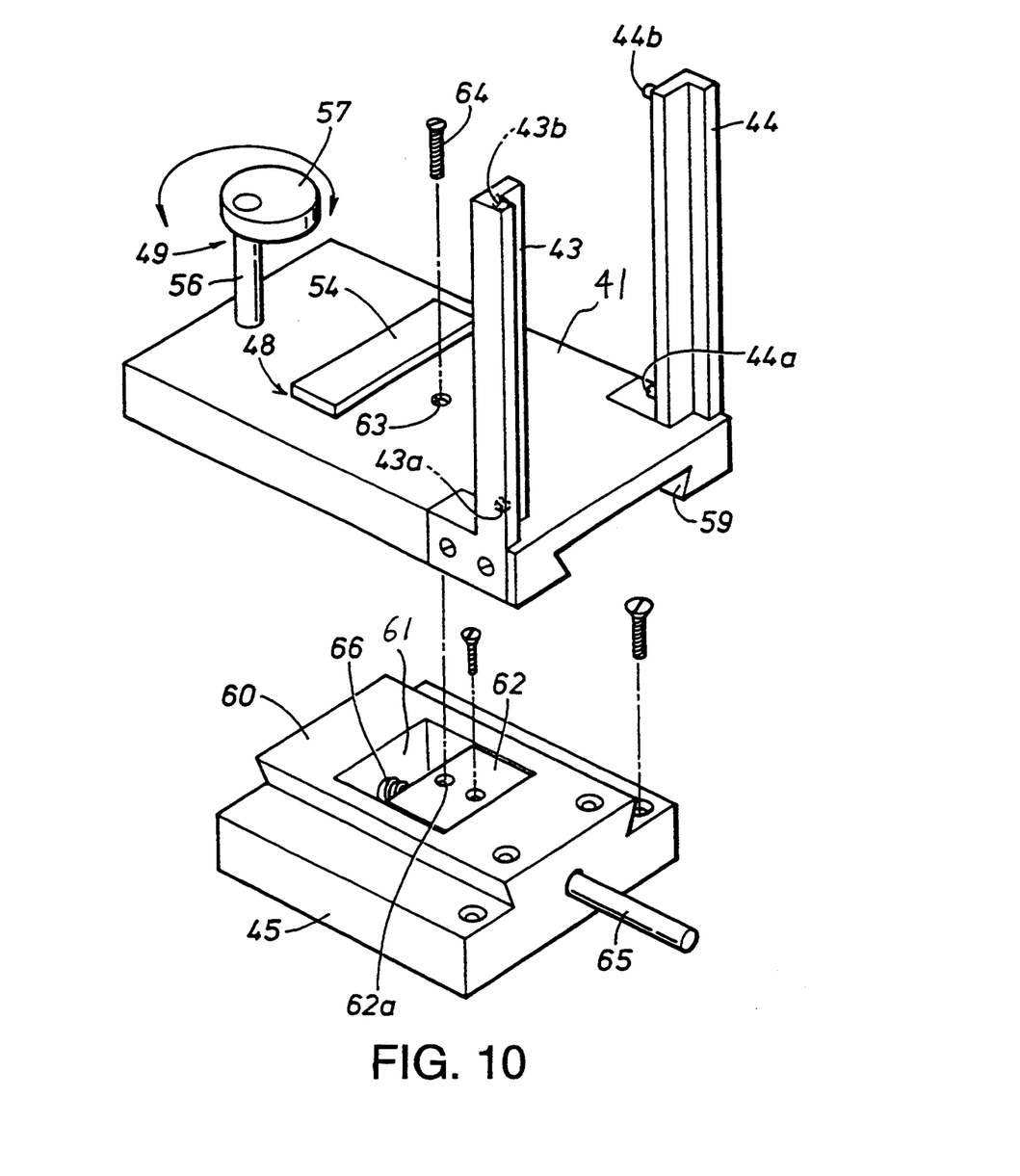
FIG. 10 is a fragmentary exploded perspective view showing the structure of the first basket supporting table.

As best illustrated in FIG. 10, a longitudinal dovetail slot 59 is provided in the lower surface of the first basket support table 41, and an associated dovetail projection 60 formed on the upper surface of the moveable support table 45 is slidably received in this slot 59 so that the first basket support table 41 can slide in the longitudinal direction with respect to the moveable support table 45. A recess 61 is provided in a central part of the projection 60, and accommodates therein a slide block 62 which is fixedly secured to the first basket support table 41 by a screw 64 passed through a hole 63 of the first basket support table 41 and threadably engaged with a threaded hole 62a of the slide block 62.

An actuation rod 65 is longitudinally passed into an end of the moveable support member 45 facing the main body A, and its inner end is passed through the slide block 62 and is slidably received in a bore provided in the opposing wall of the recess 61. The slide block 62 is fixedly secured to the actuation rod 65 by a set screw, and a compression coil spring 66 is wound around a part of the actuation rod 65 situated between the end of the slide block 62 remote from the main body A and the opposing wall surface of the recess 61.

Thus, the first basket support table 41 is normally urged toward the main body A by the compression coil spring 66, and can recede away from the main body A when the outer end of the accusation rod 65 is pushed in that direction.

The movable support table 45 is fixedly secured to the vertical guide plate 46. The vertical guide plate 46 is provided with a vertical dovetail slot 68 which engages a corresponding dovetail projection 69 provided in the end plate 3. Height adjusting means is provided between the moveable support table 45 and the end plate 3 so that the height of the vertical guide plate 46 relative to the end plate 3 may be adjusted by turning a knob 47.

The upper surface of the end plate 3 is provided with a longitudinal guide slot 70 for allowing the outer end of the actuation rod 65 shown in FIG. 10 to extend through the end plate 3 and abut a stopper block 71 provided in the main body A. The stopper block 71 is provided with a pair of laterally extending projections 71a and 71b at its lower end which are fitted into the corresponding guide slots 11 and 12 so that it can freely slide in the longitudinal direction in the space defined between the end plate 3, the two side plates 1 and 2 and the rotary shaft 13. Thus, when the carriage 5 has moved to the terminal end, the support rods 18 and 19 abut the stopper block 71 which in turn pushes the actuation rod 65 along with the slide block 62. In other words, when the carriage 5 has moved to the terminal end, the basket support table 41 is moved slightly rearward against the spring force of the compression coil spring 66 with the result that the impact which might be otherwise caused by the arrival of the carriage 5 at the terminal end is accommodated, and the resulting receding movement of the basket support table 41 has favorable effect on the transfer of wafers between the wafer support plates 7 and the support ribs 32 of the basket C1.

Furthermore, if the first wafer support table is provided with means for allowing a receding movement thereof when the carriage has abutted the first wafer support table 41, and the compression coil spring 66 for urging the first wafer support table 41 against the receding movement thereof while the cam slots 8a and 8b are provided with such a cam profile (the transitional cam portion 33) as to allow the wafers carried by the first basket C1 to be lifted or lowered while the first wafer support table 41 and the carriage 5 are moving jointly by virtue of the above mentioned structure, it is possible to prevent any rubbing between the wafer supporting plates 7 and the wafers W through elimination of relative horizontal movement between them, and can thereby minimize damages to the wafers during the handling thereof.

As described earlier, engagement between the projections and holes 51a and 51b of the flange 51 of the basket with the corresponding engagement holes 43a and 43b, and projections 44a and 44b of the positioning pillars 43 and 44 ensures the vertical positioning of the basket C1 at all times in a simple manner.

It is known that there are significant differences in the external dimensions of baskets for carrying wafers depending on the manufacturers of baskets, and the external surfaces of the baskets would not provide any reference surface for positioning purpose. However, the positions of the projections and holes 51a and 51b of the flange 51 do not vary from one basket to another, and can therefore offer a convenient reference for positioning the basket on the first basket support table 41.

Although the present invention has been described in terms of preferred embodiments thereof, it is obvious to a person skilled in the art that various alterations and modifications are possible without departing from the scope of the present invention which is set forth in the appended claims. For instance, in the above described embodiment, the carriage was actuated by hand, but it is also possible to use power means such as a pneumatic cylinder, a hydraulic cylinder, an electric motor or other known power means as long as it is arranged so as not to damage the wafers.

What is claimed is:

1. A wafer transfer device for transferring wafers from a first basket to a second basket, each of said baskets having an open front end, and a plurality of horizontal slots defined in mutually opposing inner side walls thereof for supporting a plurality of wafers in a vertically spaced relationship by receiving side edges of said wafers in said slots, comprising:

a base;

a first basket support table mounted on said base for supporting a first basket;

a second basket support table mounted on said base for supporting a second basket;

a carriage slidably supported by said base and guided by guide means provided on said base so as to be slidable toward and away from said first and second wafer baskets;

actuation means for moving said carriages toward and away from said open front ends of said first and second baskets;

a plurality of wafer support plates carried by said carriage horizontally and in a vertically spaced relationship to be inserted in gaps defined between said wafers carried by said first wafer basket; and cam means provided in said base for lifting said wafer support plates when said carriage passes a first part of said guide means where said wafer support plates are inserted in said gaps defined between said wafers carried by said first basket to thereby lift said wafes from ribs defined between said slots of said first basket, and lowering said wafer support plates when said carriage passes a second part of said guide means where side edges of said wafers supported by said wafers support plates are placed in said slots provided in said inner side walls of said second basket to thereby lower said wafers on ribs defined between said slots of said second basket.

2. A wafer transfer device according to claim 1, wherein said guide means comprises a guide slot for guiding said carriage.

3. A wafer transfer device according to claim 2, wherein said first basket support table is located behind said second basket support table, said second basket being provided with an open rear end, and said carriage is guided by said guide slot over a range in which said wafer support plates can be placed inside said first and second wafer baskets.

4. A wafer transfer device according to claim 3, wherein said carriage comprises a lifting member vertically slidably supported by a carriage main body, and said wafer support plates are mounted on said lifting member, said cam means consisting of a cam slot provided in said base and receiving a cam follower provided in said lifting member.

5. A wafer transfer device according to claim 4, wherein said cam slot includes a first path for transferring wafers from said first wafer basket to said second wafer basket, and a second path for transferring wafers from said second wafer basket to said first wafer basket, and said cam follower is carried by said lifting member so as to be moveable by switch means between a first position for engaging said cam follower with said first path of said cam slot and a second position for engaging said cam follower with said second path of said cam slot.

6. A wafer transfer device according to claim 1, wherein said first basket support table comprises a pair of positioning pillars on which a flange of said open front end of said first basket abuts, and said pillars comprises means for positioning said flange in cooperation with associated positioning means provided on said flange.

7. A wafer transfer device according to claim 6, further comprising elastic support means for elastically urging said first basket placed on said first basket support table upward, and means for pushing a rear end of said first wafer basket against said positioning pillars.

8. A wafer transfer device according to claim 1, wherein said first wafer support table is provided with means for allowing a receding movement thereof when said carriage has abutted said first wafer support table, and spring means for urging said first wafer support table against said receding movement thereof, said cam means being provided with such a cam profile as to allow said wafers carried by said first basket to be lifted or lowered while said first wafer support table and said carriage are moving jointly by virtue of said means for allowing a receding movement of said first wafer support table and said spring means.

9. A wafer transfer device for transferring wafers from a first basket to a second basket, each of said baskets having an open front end, and a plurality of horizontal slots defined in mutually opposing inner side walls thereof for supporting a plurality of wafers in a vertically spaced relationship by receiving side edges of said wafers in said slots, comprising:

a base extending in a longitudinal direction;

a first basket support table mounted on one longitudinal end of said base for supporting a first basket with said open end thereof facing inward;

a second basket support table mounted on said base for supporting a second basket having an open rear end next to said first basket with said rear end of said second basket facing said of open front end of said first basket;

a carriage slidably supported by said base and guided by guide means so as to be longitudinally slidable toward and away from said first and second wafer baskets;

actuation means for moving said carriage toward and away from said open front ends of said first and second baskets;

a plurality of wafer support plates carried by said carriage horizontally and in a vertically spaced relationship to be inserted in gaps defined between said wafers carried by said first wafer basket; and cam means provided in said base for lifting said wafer support plates when said carriage passes a first part of said guide means where said wafer support plates are inserted in said gaps defined between said wafers carried by said first basket to thereby lift said wafers from ribs defined between said slots of said first basket, and lowering said wafer support plates when said carriage passes a second part of said guide means where side edges of said wafers supported by said wafer support plates are placed in said slots provided in said inner side walls of said second basket to thereby lower said wafers on ribs defined between said slots of said second basket.

* * * * *